United States Patent
Shao et al.

(10) Patent No.: US 11,510,346 B2
(45) Date of Patent: Nov. 22, 2022

(54) METHOD AND SYSTEM FOR ENHANCING ELECTRONICS COOLING USING A THERMOELECTRIC ELEMENT

(71) Applicant: Baidu USA LLC, Sunnyvale, CA (US)

(72) Inventors: Shuai Shao, Sunnyvale, CA (US); Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 116 days.

(21) Appl. No.: 17/001,176

(22) Filed: Aug. 24, 2020

(65) Prior Publication Data
US 2022/0061191 A1 Feb. 24, 2022

(51) Int. Cl.
*H05K 7/20* (2006.01)
*G06F 1/20* (2006.01)

(52) U.S. Cl.
CPC ......... *H05K 7/20836* (2013.01); *G06F 1/206* (2013.01); *H05K 7/20763* (2013.01)

(58) Field of Classification Search
CPC .. H05K 7/20763; H05K 7/20836; G06F 1/20; G06F 1/206
See application file for complete search history.

(56) References Cited

U.S. PATENT DOCUMENTS

| | | | |
|---|---|---|---|
| 6,798,655 B2 * | 9/2004 | Nagashima | G06F 1/20 361/679.48 |
| 2005/0174737 A1 * | 8/2005 | Meir | G06F 1/20 361/697 |
| 2015/0082811 A1 * | 3/2015 | Rangarajan | G06F 1/206 62/3.7 |
| 2017/0242463 A1 * | 8/2017 | Matteson | G05B 15/02 |
| 2019/0098796 A1 * | 3/2019 | Wakino | H05K 7/20272 |
| 2019/0246518 A1 * | 8/2019 | Shen | H05K 7/20254 |
| 2020/0120831 A1 * | 4/2020 | Saito | H05K 7/20236 |

OTHER PUBLICATIONS

"Thermoelectric Coolers Intro The Basics", TEC Microsystems GmbH, accessed online on Jun. 15, 2020, available online at: <https://www.tec-microsystems.com/faq/thermoelectic-coolers-intro.html>.

* cited by examiner

*Primary Examiner* — Mark A Connolly
(74) *Attorney, Agent, or Firm* — Womble Bond Dickinson (US) LLP

(57) ABSTRACT

According to one embodiment, an immersion cooling system includes a coolant tank that has liquid coolant and contains at least partially submerged within the liquid coolant 1) a thermoelectric cooling (TEC) element that is coupled to an information technology (IT) component that is mounted on a piece of IT equipment, and 2) a heat sink that is coupled to the TEC element, wherein the TEC element is configured to transfer heat generated by the IT component into the liquid coolant via the heat sink.

20 Claims, 8 Drawing Sheets

METHOD AND SYSTEM FOR ENHANCING ELECTRONICS COOLING USING A THERMOELECTRIC ELEMENT

FIELD

Embodiments of the present disclosure relate generally to cooling electronics using a thermoelectric cooling (TEC) element.

BACKGROUND

Thermal management for a data center that includes several active electronic racks is critical to ensure proper performance of servers and other IT equipment (e.g., performing IT data processing services) that is operating in the racks. Without proper thermal management, however, the thermal environment (e.g., temperature) within the racks may exceed thermal operational thresholds, which may result in adverse consequences (e.g., servers failing, etc.). One way to manage the thermal environment is the use cooling air to cool the IT equipment. The cooling air is recirculated using cooling units that extract heat captured by the cooling air. One commonly used cooling unit is a computer room air conditioning (CRAC) unit that is a device that intakes hot exhaust air and supplies cooling air into the data center to maintain the data center's thermal environment. The CRAC is an air cooling unit that is widely used in existing air cooled data centers, and there are many other types of solutions for air cooled data centers. Also, a majority of existing data centers are air cooled.

Recently, data centers have been deploying more high-power density electronic racks, where more high-density chips are packaged closer together to provide more processing power. This is especially the case due to developments in artificial intelligence (AI) and cloud-based services, which require high performance and high power density processors, such as control processing units (CPUs) and graphic processing units (GPUs). Cooling these high-density racks by maintaining a proper thermal environment may be an issue with existing cooling systems, such as a CRAC unit. For instance, although the CRAC unit may maintain the thermal environment with more conventional (or lower-density) racks, the unit may be unable to effectively cool high-power density racks because they may generate heat load at a higher rate due to the higher density electronics. In some cases, liquid cooling becomes a more efficient and feasible cooling solution in high power density or high heat flux scenarios.

Immersion cooling, on the other hand, which involves at least partially submerging electronics in a dielectric solution is a feasible solution for high-density electronics. Implementing immersion cooling, however, has challenges. For example, heat sink structures need to be customized for good thermal performance, since the working medium is not air anymore. Also, unlike air-cooling, immersion cooling depends on several factors, such as material properties of specific dielectric fluids and the elevation at which immersion cooling is performed. Changing location (e.g., elevation) or using different fluids may cause a significant performance degradation on immersion cooling.

BRIEF DESCRIPTION OF THE DRAWINGS

The aspects are illustrated by way of example and not by way of limitation in the figures of the accompanying drawings in which like references indicate similar elements. It should be noted that references to "an" or "one" aspect of this disclosure are not necessarily to the same aspect, and they mean at least one. Also, in the interest of conciseness and reducing the total number of figures, a given figure may be used to illustrate the features of more than one aspect, and not all elements in the figure may be required for a given aspect.

DETAILED DESCRIPTION

Figure 1:
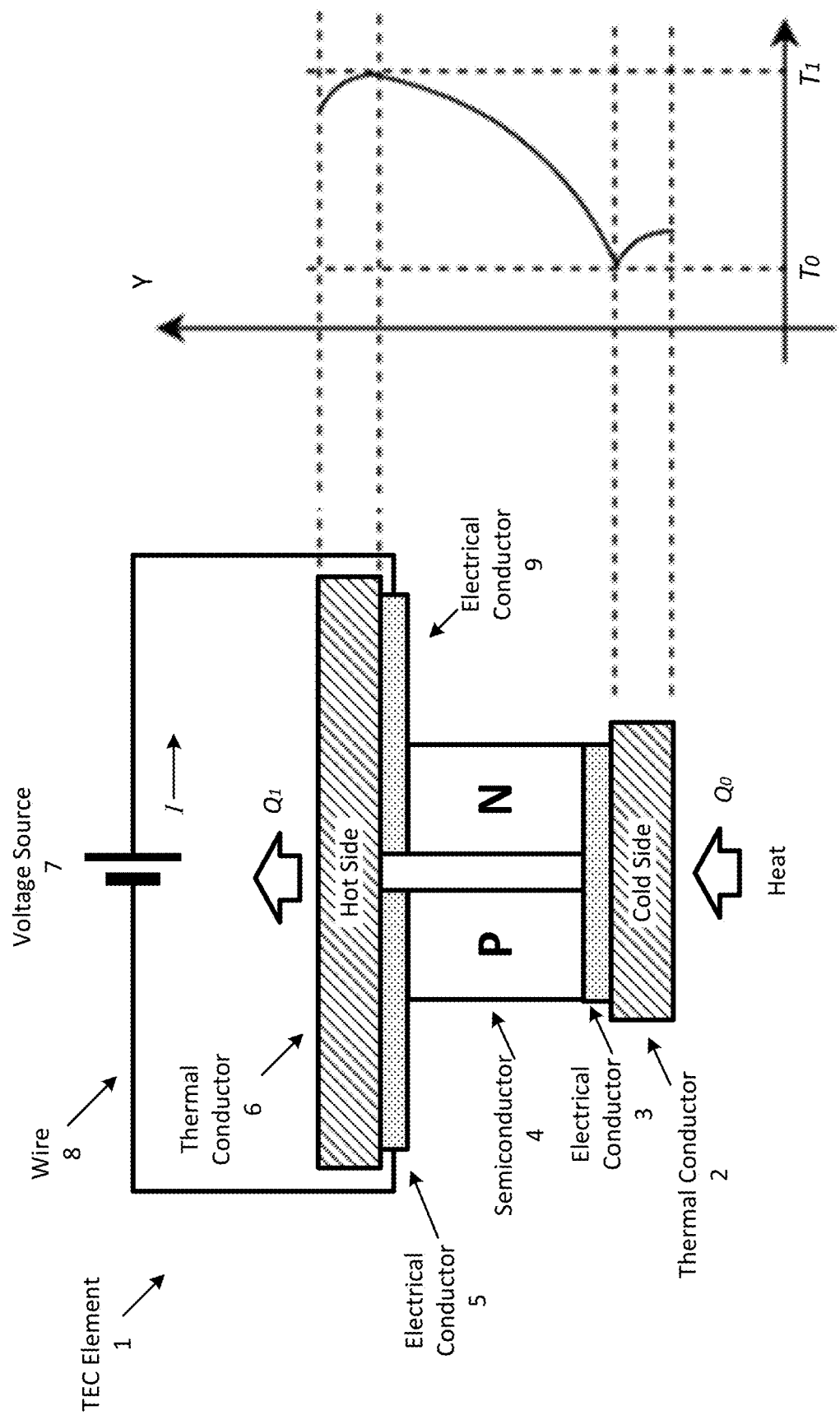
FIG. 1 is a block diagram illustrating an example of a thermoelectric cooling (TEC) element according to one embodiment.

Several aspects of the disclosure with reference to the appended drawings are now explained. Whenever the shapes, relative positions and other aspects of the parts described in a given aspect are not explicitly defined, the scope of the disclosure here is not limited only to the parts shown, which are meant merely for the purpose of illustration. Also, while numerous details are set forth, it is understood that some aspects may be practiced without these details. In other instances, well-known circuits, structures, and techniques have not been shown in detail so as not to obscure the understanding of this description. Furthermore, unless the meaning is clearly to the contrary, all ranges set forth herein are deemed to be inclusive of each range's endpoints.

Reference in the specification to "one embodiment" or "an embodiment" means that a particular feature, structure, or characteristic described in conjunction with the embodiment can be included in at least one embodiment of the disclosure. The appearances of the phrase "in one embodiment" in various places in the specification do not necessarily all refer to the same embodiment.

The present disclosure solves the problems described herein by providing an immersion cooling system that deploys one or more thermoelectric cooling (TEC) elements (or thermoelectric elements), which may be configured to operate in one or more operational modes. The immersion cooling system includes a coolant tank that contains a TEC element mounted to electronics, specifically an information technology (IT) component (e.g., processor or chip) that is mounted on a piece of IT equipment (e.g., a printed circuit board (PCB)), all of which is at least partially submerged within liquid coolant. During operation, the TEC element is configured to transfer heat generated by the IT component into the liquid coolant (e.g., via a heat sink that is mounted on the TEC element). To control the TEC element, the cooling system may also include a TEC controller that is configured to draw power from a power source (e.g., from the PCB or an external power source), and control the transfer of heat by applying an input voltage across the TEC element. In addition, the TEC controller may be configured to operate in various operational modes in order to adapt to changing cooling requirements of the IT component. For example, the more processing power used by the IT component, the more heat that may be generated, and as a result the IT component may require more cooling. The TEC controller may operate in a first operational mode (e.g., an efficiency mode) in which the TEC element is driven with minimum power overhead, while all (or most) generated heat is transferred away from the IT component and the component's temperature is (e.g., maintained) below a maximum allowable temperature threshold. As another example, the TEC controller may operate in a second operational mode (e.g., a performance mode) in which the TEC element is driven such that the temperature of the IT component is a lowest available temperature. Specifically, this mode provides for the lowest achievable temperature of the IT component while the TEC element is driven by the TEC controller. Thus, the TEC controller is able to adjust the thermal performance of the cooling system based on changing cooling requirements of the IT component.

According to one embodiment, an immersion cooling system includes a coolant tank that has liquid coolant and contains at least partially submerged within the liquid coolant 1) a thermoelectric cooling (TEC) element that is coupled to an information technology (IT) component that is mounted on a piece of IT equipment, and 2) a heat sink that is coupled to the TEC element, where the TEC element is configured to transfer heat generated by the IT component into the liquid coolant via the heat sink.

In one embodiment, the immersion cooling system further includes a TEC controller that is mounted on the piece of IT equipment and is electrically coupled to the TEC element, where the TEC controller is configured to draw power from the piece of IT equipment and is configured to control the transfer of heat by the TEC element by applying an input voltage across the TEC element. In some embodiments, the TEC controller is configured to sense a power input of the IT component and is configured to operate in one of a plurality of operational modes based on whether the power input of the IT component exceeds a power threshold. In one embodiment, in response to the power input being less than the power threshold, the TEC controller is configured to operate in a first operational mode of several operational modes in which the input voltage is a minimum voltage, which when applied across the TEC element causes the TEC element to transfer all of the heat generated by the IT component into the heat sink while a temperature of the IT component remains below a maximum temperature threshold, and, in response to the power input being greater than the power threshold, the TEC controller is configured to operate in a second operational mode of the plurality of operational modes in which the applied input voltage causes the TEC element to transfer all of the heat generated by the IT component into the heat sink while the temperature of the IT component is a lowest available temperature.

In one embodiment, the TEC element and the heat sink is one integrated unit. In some embodiments, a thermal interface material (TIM) is disposed between at least one of 1) the IT component and the TEC element and 2) the TEC element and the heat sink.

According to another embodiment, a method for immersion cooling an information technology (IT) component includes determining a power input of an active IT component that is mounted on a piece of IT equipment contained within a coolant tank that has liquid coolant, wherein mounted on the IT component is a thermoelectric cooling (TEC) element and a heat sink in a stack in which the TEC element is disposed between the IT component and the heat sink, wherein the stack is at least partially submerged within the liquid coolant; determining whether the TEC element is to operate according to a first operational mode or a second operational mode; and in response to determining that the TEC element is to operate according to the first operational mode, computing a critical temperature difference of the TEC element, determining a temperature difference of the TEC element and a voltage based on the power input, determining whether the temperature difference is greater than the critical temperature difference, and in response to determining that the temperature difference is greater than the critical temperature difference, applying the voltage across the TEC element.

In one embodiment, determining the temperature difference and the voltage includes using the power input to identify a maximum coefficient of performance (COP) of the TEC element that is associated with the temperature difference and the voltage. In some embodiments, the voltage is a first voltage, the method further includes, in response to determining that the temperature difference is less than the critical temperature difference, determining a second voltage based on the critical temperature difference; and applying the second voltage across the TEC element.

In one embodiment, the voltage is a first voltage, the method further includes, in response to determining that the TEC element is to operate according to the second operational mode, determining an operating current for the TEC element that is associated with a lowest available temperature of the IT component based on the power input; determining whether the lowest available temperature is less than a maximum temperature of the IT component; and in response to determining that the lowest available temperature is less than the maximum temperature of the IT component, applying a second voltage associated with the operating current across the TEC element. In some embodiments, the method further includes, in response to determining that the lowest available temperature is greater than the maximum temperature of the IT component, deactivating the active IT component.

In one embodiment, determining whether the TEC element is to operate according to the first operational mode or the second operational mode includes selecting the first operational mode when the power input of the active IT component is less than a power threshold; and selecting the second operational mode when the power input of the active IT component is greater than the power threshold. In some embodiments, determining whether the TEC element is to operate according to the first operational mode or the second operational mode comprises selecting one of the first and second operational modes in response to user input.

According to another embodiment, a non-transitory machine-readable medium having instructions stored therein, which when executed by a processor, causes the processor to perform operations that are similar to the operations performed in the method described herein.

In one embodiment, as used herein, "to couple" one component (or element) to another component may refer to "fluidly" coupling the two components together in order to allow a fluid, such as a cooling liquid or liquid coolant to flow between the two components. For example, coupling a first tube to a second tube may couple both tubes together and also allow a fluid to flow from the first tube into the second tube.

FIG. 1 is a block diagram illustrating an example of a TEC element (or TEC device) according to one embodiment. This figure shows a TEC element 1 that has (at least) two semiconductors 4, a p-type semiconductor and a n-type semiconductor, having different electron densities (e.g., n-type>p-type). These semiconductors may be arranged as pillars that are placed thermally in parallel to each other, and electrically in series by an electrical conductor 3 that is connected to a thermal conductor 2. Each end of the semiconductors that is not connected to the electronic conductor 3 is connected to a separate conductor. In particular, the p-type semiconductor is connected to an electrical conductor 5, while the n-type semiconductor is connected to another electrical conductor 9, which is separate from conductor 5. Both of the electrical conductors 5 and 9 are connected to another terminal conductor 6. In addition, the electrical conductor 5 is electrically coupled to a negative terminal of a voltage source 7 and the electrical conductor 9 is electrically coupled to a positive terminal of the voltage source (e.g., via one or more wires 8). In one embodiment, the voltage source may be an external voltage source (e.g., separate from the TEC element 1). In another embodiment, the voltage source and the TEC element may be coupled to one another. For example, both elements may be a part of an electrical component (e.g., both mounted on a PCB board). In some embodiments, the voltage source may be a part of one or more controllers, such as the TEC controllers 12 as shown in FIG. 2.

In one embodiment, any of the components of the TEC element may be composed of any (known) material. For example, the thermal conductors 2 and 6 may be made of a ceramic material, which can conduct heat but not electricity. As another example, the electrical conductors 3, 5, and/or 9 may be composed of any conductor material (e.g., copper, etc.).

The TEC element is arranged to move heat from one surface to another surface, at the cost of extra external electrical power. Specifically, when a voltage (e.g., 10 volts) is applied by the voltage source 7 across the two electrical conductors 5 and 9, a current I (e.g., 10 amperes) passes through the semiconductors, causing the TEC element to transfer heat $Q_0$ from the "cold side" to the "hot side". Thus, a temperature difference is generated by the semiconductor 4 as current passes through it, as shown by $T_0-T_1$. The heat that is ultimately expelled out of the hot side is $Q_1$, which may be greater than $Q_0$ because $Q_1$ may include $Q_0$ and any heat, $Q'$ that is generated by the TEC element while the TEC is active. In other words, $Q_1=Q_0+Q'$. Thus, during operation as part of a cooling system as described herein, the thermal conductor 2 may be coupled to (e.g., mounted on) an IT component, such that the TEC element draws $Q_0$ generated by the IT component away from the component and into the thermal conductor 6. Drawing this heat away from the IT component thus cools the IT component while it is active and the TEC element is operational.

Figure 2:
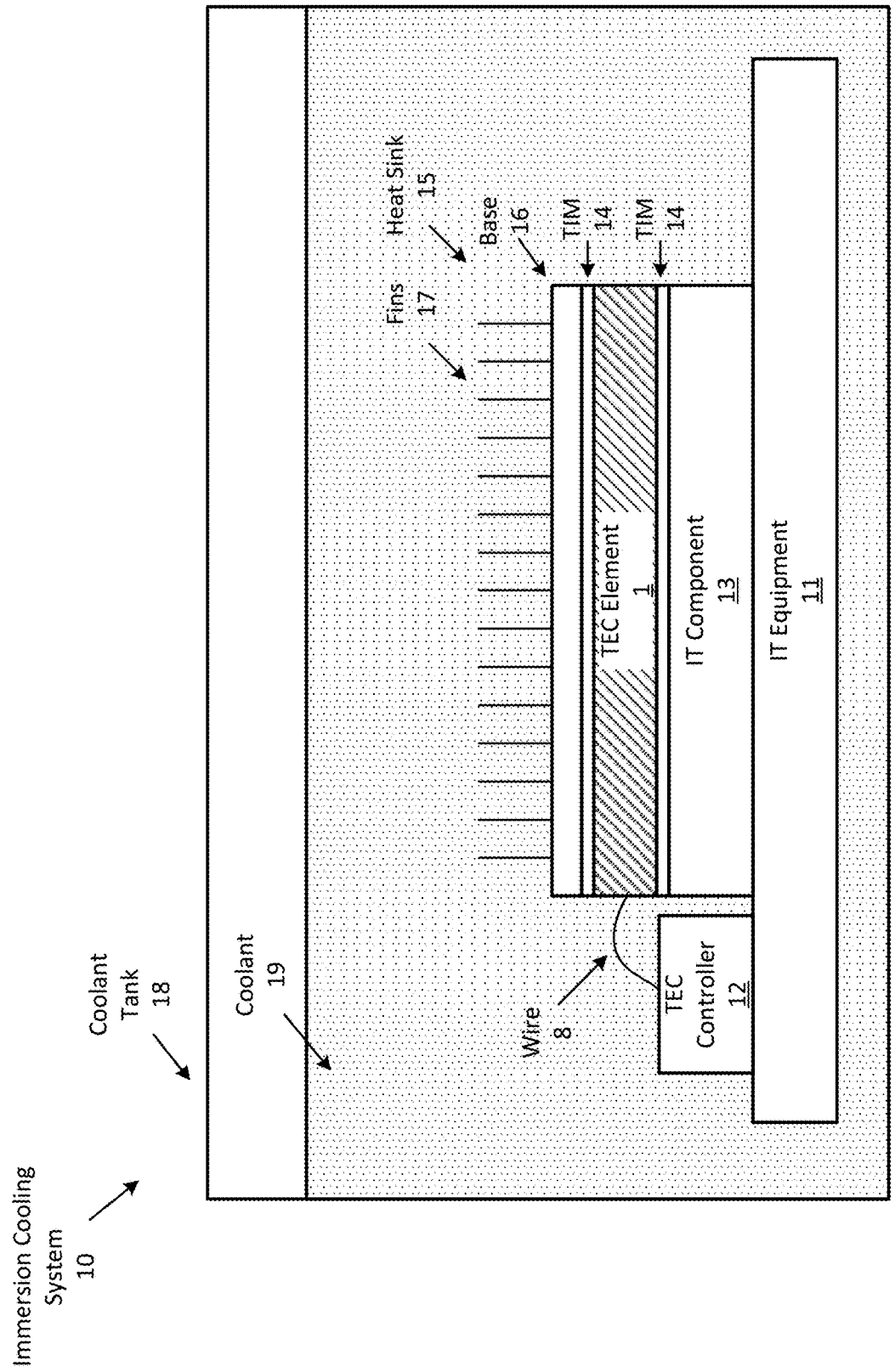
FIG. 2 is a block diagram illustrating an example of an immersion cooling system that includes a TEC element according to one embodiment.

FIG. 2 is a block diagram illustrating an example of an immersion cooling system that includes a TEC element according to one embodiment. Specifically, this figure shows an immersion cooling system 10 (which hereafter may be referred as cooling system) that is configured to immersion cool one or more IT components coupled to (or mounted on) one or more pieces of IT equipment 11. As shown, the system includes a piece of IT equipment 11, a TEC controller 12, an IT component 13, a TEC element 1, a heat sink 15, a coolant tank 18, and coolant 19. In one embodiment, the system may include more or less elements (or components). For example, the system may include one or more pieces of IT equipment, each piece of IT equipment including one or more mounted elements as shown here. As another example, the system may not include a coolant tank or coolant. In that case, the cooling system may be air-cooled. More about an alternative air-cooling system is described herein.

In one embodiment, the piece of IT equipment 11 may be any element (such as a PCB as described herein) that is arranged to hold one or more IT components and/or any type of electrical component, such as the TEC controller 12. In some embodiments, the piece of IT equipment may be a blade server that is arranged to be (at least partially) submerged within liquid coolant and/or arranged to be mounted in an electronic server rack.

The piece of IT equipment 11 may include one or more IT components 13 (e.g., central processing units or CPUs, graphical processing units (GPUs), memory, and/or storage devices). The IT component may perform data processing tasks, where the IT component may include software installed in a storage device, loaded into the memory, and executed by one or more processors to perform the data processing tasks. In one embodiment, the piece of IT equipment may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. The performance compute servers (e.g., the IT component 14) perform the actual tasks, which may generate heat during the operations. This heat, as described herein needs to be transferred away from the component in order to ensure that it does not overheat, which may result in failure.

The TEC element 1 is arranged to couple to the IT component 13. A described herein, this figure shows that the TEC element is mounted on the IT component. Coupled to the TEC element is the heat sink 15, which includes a base 16 and one or more fins 17. In particular, the base is arranged to couple to (e.g., mount on) the TEC element. Thus, the IT component, the TEC element, and heat sink are arranged in a stack. In this example, each of the elements may be separate elements which may be removeably coupled within the stack. For example, the TEC element may be removed from atop the IT component and the heat sink may be separated from the TEC element. As a result, elements may be added/removed from the stack as needed (e.g., in case of an element failure). In another embodiment, at least some of the elements may be packaged together as one integrated unit. For example, the (e.g., base of the) heat sink and the TEC element may be one integrated unit.

The TEC element 1 is configured to transfer (e.g., at least a portion of the) heat generated by the (e.g., active) IT component (e.g., $Q_0$) into the one or more fins 17 of the heat sink 15. For example, in this figure, the cold side (e.g., thermal conductor 2, shown in FIG. 1) of the TEC element may be coupled to the IT component 13 and the hot cold side (e.g., the thermal conductor 6, shown in FIG. 1) of the TEC element may be coupled to the heat sink 15 in order to transfer the heat away from the IT component, thereby reducing its temperature. As described herein, the heat transferred to the fins may then be rejected (or transferred) into coolant 19 that is surrounding and/or flowing between the fins. More about operating the TEC element is described herein.

In one embodiment, disposed between (at least some of these) elements is a thermal interface material (TIM) 14, which may be a thermal pad, a thermal adhesive tape, and/or a thermal conductive paste. Specifically, TIM is disposed between 1) the IT component 13 and the TEC element 1, and 2) the TEC element and the (base 16 of the) heat sink 15. In one embodiment, TIM 19 may not be disposed between at least some of the elements. For example, the TEC element and the heat sink may be directly coupled to one another. As another example, TIM may not be disposed between two elements that form one integrated unit, as may be the case when the TEC element and the heat sink are one integrated unit, as described herein.

The TEC controller 12 may be a special-purpose processor such as an application-specific integrated circuit (ASIC), a general purpose microprocessor, a field-programmable gate array (FPGA), a digital signal controller, or a set of hardware logic structures (e.g., filters, arithmetic logic units, and dedicated state machines). In one embodiment, the TEC controller may be a circuit with a combination of analog elements (e.g., resistors, capacitors, inductors, etc.) and/or digital elements (e.g., logic-based elements, such as transistors, etc.). The TEC controller may also include memory. As shown, the TEC controller and the IT component 13 are separate elements that are coupled to (e.g., mounted on) the piece of IT equipment 11. In one embodiment, the TEC controller 12 may be a part of the TEC element 1 (e.g., within one container). In another embodiment, the TEC controller may be a part of (or integrated within) the IT component 13. In another embodiment, the TEC controller may be one of (or a part of) another piece of IT equipment (e.g., that is contained within the coolant tank 18 or in another location, such as mounted in an electronic rack).

The coolant tank 18 is a container that is designed to hold (or contain) coolant and one or more pieces of IT equipment. In one embodiment, the tank may be formed from one or more materials, such as plastic, metal, etc. In one embodiment, the tank may have one or more openings (e.g., at a top of the tank), to allow a technician to add or remove pieces of IT equipment and/or to replenish coolant within the tank. As illustrated, the tank contains coolant 19 and the rest of the elements described herein (e.g., the TEC element, IT component, IT equipment, TEC controller, and heat sink), which are at least partially submerged within the coolant. In one embodiment, the (liquid) coolant 19 may be any type of thermally conductive dielectric liquid. In another embodiment, the coolant may be a non-toxic fluid. In some embodiments, the coolant may be designed and operated to have a high boiling point (e.g., above a threshold operating temperature (e.g., maximum temperature threshold) of at least some of the major components of the pieces of IT equipment).

As shown, the TEC controller 12 is (e.g., electrically) coupled via one or more wires 8 to the TEC element 1. The TEC controller is configured to activate (or operate) the TEC element, such that the TEC element may (e.g., begin to) transfer (at least a portion of the) heat generated by the IT component into (the one or more of the fins 17 of) the heat sink 15 which is ultimately rejected into the coolant 19, as described herein. In one embodiment, the TEC controller may include a power source or may be electrically coupled to a power source, which may be a part of the piece of IT equipment 11 or may be an external power source. The TEC controller may be configured to draw power from the power source (e.g., from the piece of IT equipment) and may be configured to supply the TEC element with an input current in order to activate the element. Specifically, the TEC controller may be configured to control the transfer of heat by the TEC element by applying an input voltage across the TEC element. Thus, once activated, heat generated by the IT component is drawn by the TEC element and transferred, into the heat sink. The heat is then transferred into the fins of the heat sink and is then rejected into the coolant 19.

In one embodiment, the TEC controller is configured to operate in one of several operational modes. In particular, the TEC controller may operate in an efficiency mode or a performance mode, as described herein. While in these modes, the TEC controller may adjust the input voltage applied across the TEC element, thereby controlling the transfer of heat in order to accommodate changing cooling requirements by the IT component. Cooling requirements may change based on the amount of processing power (or power input) that is being performed drawn by the IT component in order to perform one or more computational operations. As one example, the TEC controller may operate in an efficiency mode, while the power input of the IT component is below a power threshold. While in this mode, the IT component is cooled by the TEC element, while the amount of power overhead required by the TEC controller to drive the TEC element is minimized. On the other hand, when the power exceeds the power threshold, the TEC controller may switch to the performance mode, which ensures that the IT component remains as cool as possible. More about both of these modes and determining which mode the TEC controller is to operate, is described herein.

Figure 3:
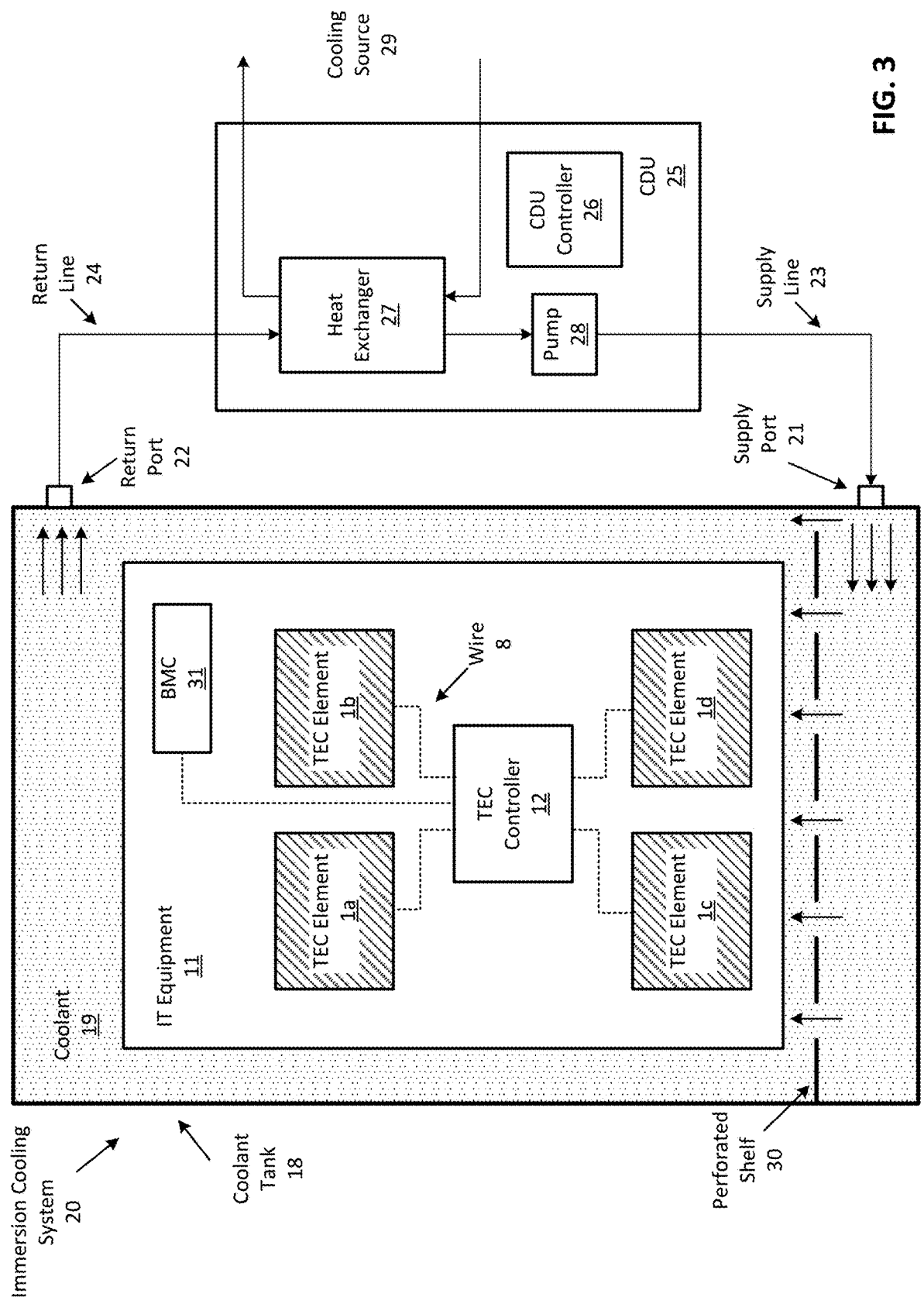
FIG. 3 is a block diagram illustrating an immersion cooling system that includes a cooling distribution unit (CDU) according to one embodiment.

FIG. 3 is a block diagram illustrating an immersion cooling system that includes a cooling distribution unit (CDU) according to one embodiment. Specifically, this figure shows that the coolant tank 18 is coupled to a CDU 25, thereby creating a (e.g., secondary) heat exchanging loop, as described herein. Contained within the coolant tank is the piece of IT equipment 11 that includes four TEC elements 1a-1d, each mounted on at least one IT component (not shown) that are mounted on the IT equipment. Also, although not shown, each of the TEC elements may include one or more heat sinks mounted thereon. In one embodiment, the piece of IT equipment may include more or less TEC elements (e.g., based on having more than four IT components). For example, when the IT equipment has eight IT components, the cooling system 20 may include eight TEC elements, one for each of the IT components. Also show, each of the TEC elements is coupled to the TEC controller 12, via one or more wires 8. In one embodiment, the TEC controller may be configured to control each of the TEC elements independently from one another.

Also, the piece of IT equipment includes a board management controller (BMC) 31 that is communicatively coupled with the TEC controller. The BMC is configured to communicate with one or more of the IT components that are mounted on the piece of IT equipment 11. For example, the BMC may be communicatively coupled with one or more sensors of each of the IT components, such as a temperature sensor. The BMC may be configured to receive a temperature reading (e.g., as a signal) from the temperature sensor and may be configured to transmit the temperature reading(s) (e.g., associated with each of the IT components) to the TEC controller 12. As another example, the BMC may sense the temperature of the coolant 19 from one or more temperature sensors within the coolant tank 18 and/or from the CDU. In another embodiment, the BMC is configured to detect (sense) the power input of each of the IT components (e.g., by measuring the input voltage and/or the input current of the IT components). The BMC is configured to communicate this data (e.g., temperature readings, power readings, etc.) of at least one of the IT components of the piece of IT equipment to the TEC controller 12. In another embodiment, the TEC controller may directly communicate with one or more of the IT components and/or one or more sensors, as described herein.

As shown, the coolant tank 18 includes a supply port 21, a return port 22 and a perforated shelf 30. The supply port 21 is an inlet that is arranged to couple to the CDU 25 via a supply line 23. The return port 22 is an outlet that is arranged to couple to the CDU via a return line 24. In one embodiment, the ports may be configured to removeably couple to their respective lines. For example, the ports may be connectors, such as dripless blind mating quick disconnects. In this case, each of the ports may be socket-type dripless connectors, while their respective lines include plug-type ends that are arranged to connect to the port connectors.

The CDU 25 includes a heat exchanger 27, a liquid pump 28, and a CDU (e.g., pump) controller 26. In one embodiment, the CDU may include other elements, such as a liquid reservoir, a power supply, monitoring sensors, etc. Note, that the CDU may be any kind of commercially available or customized CDU.

The heat exchanger 27 may be a liquid-to-liquid heat exchanger. In one embodiment, the heat exchanger may include (or be a part of) one or more heat exchanging loops. For example, the heat exchanger 27 includes a (e.g., primary) heat exchanging loop with a cooling source 29 in which cooling liquid is received from the source (e.g., via a supply line) and warmed liquid is returned to the source (e.g., via a return line). In one embodiment, the cooling source may an IT liquid cooling water system or any type of cooling liquid source.

In one embodiment, the cooling liquid circulating within the primary heat exchanging loop is warmed due to the transfer of heat from within the secondary heat exchanging loop. The secondary heat exchanging loop works as follows. Coolant 19 is supplied by the (e.g., pump 28 of the) CDU through the supply port 21 (via the supply line 23) into the coolant tank. The coolant 19 flows through the perforated shelf 30, which may be designed to increase fluid flow rate within the tank. As coolant moves upward through the tank, heat generated by IT components is transferred by respective TEC elements 1c and 1d (via heat sinks) into the flowing coolant. The transfer of heat warms the coolant, which then continues to travel upward to cool the IT components on which TEC elements 1a and 1b are mounted. In one embodiment, IT components that are mounted below the TEC controller 12 may have low temperature requirements than the IT components mounted above the controller. Warmed coolant travels through the return port 22 and to the heat exchanger 27 via the return line 24. The heat exchanger cools the warmed coolant by transferring heat contained therein into cooling liquid flowing through the primary heat exchanging loop (from the cooling source 29). The heat exchanger provides cooled coolant to the pump 28, which then recirculates cooled coolant through the secondary loop.

Figure 4:
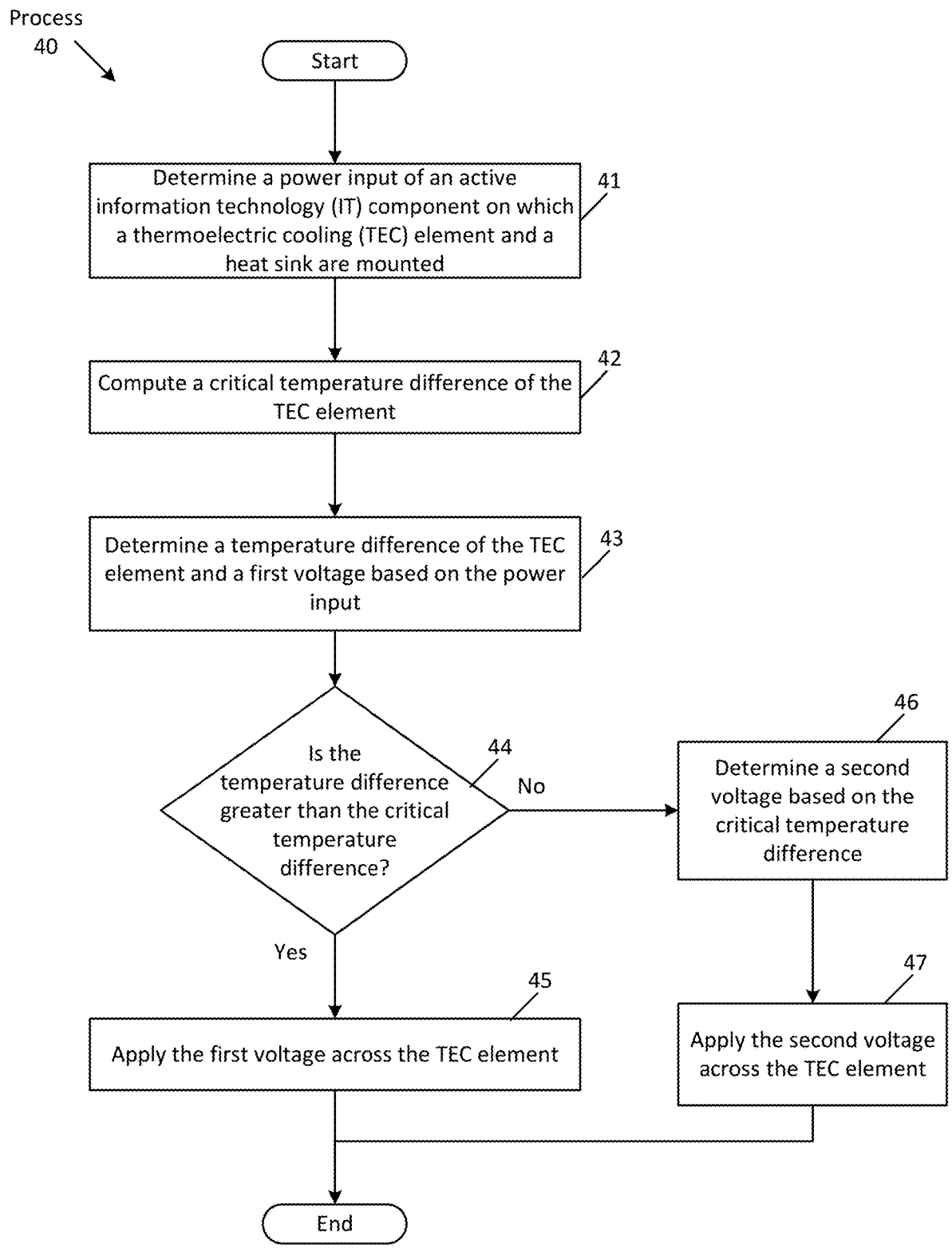
FIG. 4 is a flow chart of a process performed by an immersion cooling system to operate in an efficiency mode according to one embodiment.
Figure 6:
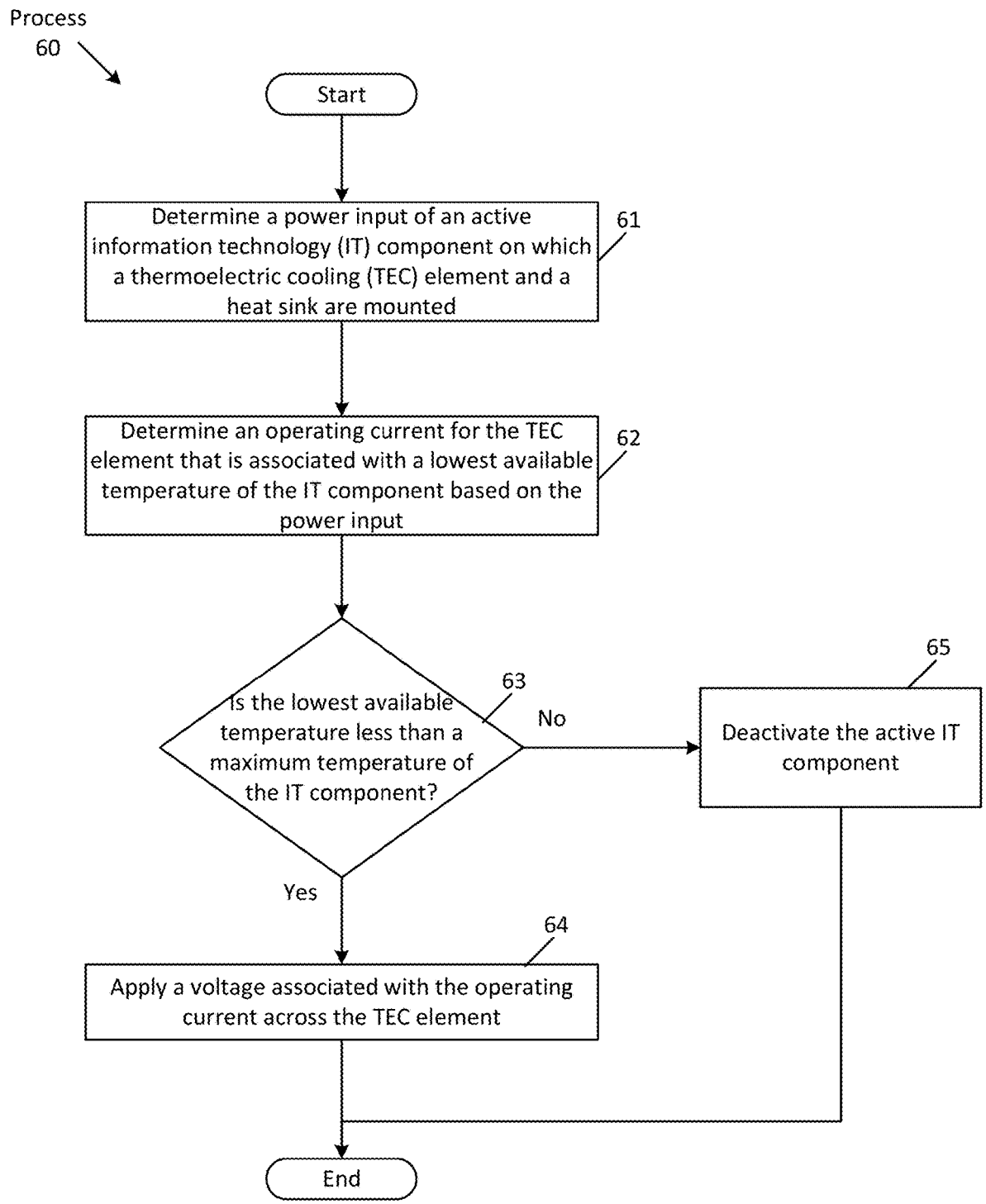
FIG. 6 is a flow chart of a process performed by an immersion cooling system to operate in a performance mode according to one embodiment.
Figure 8:
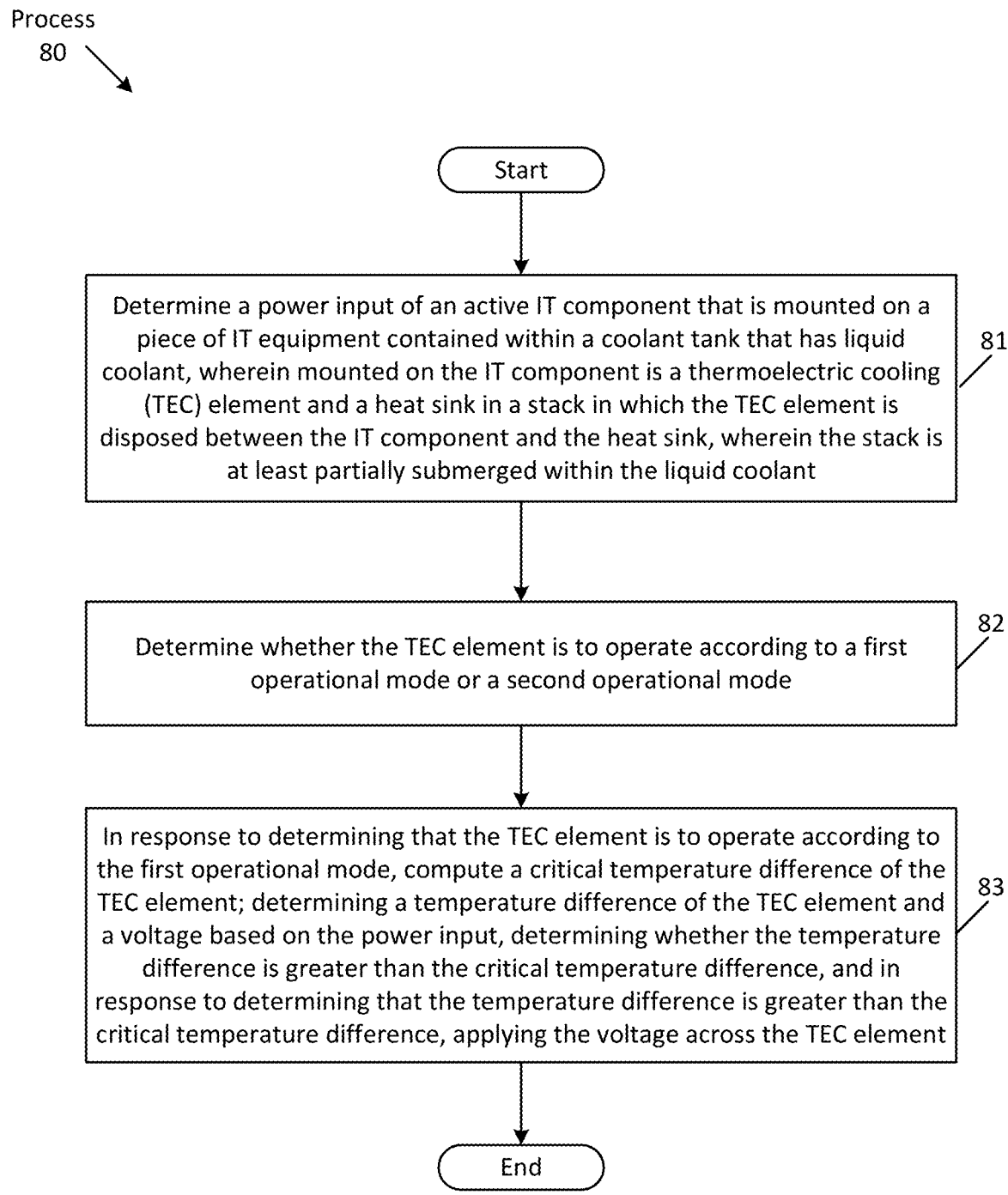
FIG. 8 is a flow chart of a process performed by an immersion cooling system according to one embodiment.

FIGS. 4, 6, and 8 are flow charts that include processes that are performed by a cooling system to operate in one of several operational modes. Specifically, at least one of the processes may be performed by (e.g., one or more algorithms executing on) the TEC controller 12 (and/or the BMC 31) of any of the (immersion) cooling systems illustrated and described herein.

FIG. 4 is a flow chart of a process performed by an immersion cooling system to operate in an efficiency mode according to one embodiment. Specifically, this figure illustrates process 40 in which the TEC controller 12 may operate in the efficiency (e.g., a first operational) in which a minimum (e.g., input) voltage is applied across the TEC element 1, which causes the TEC element to transfer all heat generated by the IT component 13 into the heat sink 15 (which is ultimately rejected into coolant 19) while a IT component temperature remains below a maximum threshold temperature.

The process 40 begins by determining a power input of an active IT component on which the TEC element and a heat sink are mounted (at block 41). For example, the BMC 31 may sense the power drawn by the IT component while the IT component is performing one or more computational operations. The BMC may transmit power data to the TEC controller 12. The process 40 computes a critical temperature difference, $\delta T_c$, of the TEC element 1 (at block 42). In FIG. 2, heat transfer mechanics may be expressed as $$T_{hs,base} - T_{liquid,in} = (Q_0 + Q') * R_{hs} \qquad (1)$$

where $T_{hs,base}$ is temperature on the base 16 of the heat sink 15, $T_{liquid,in}$ is the temperature of the coolant 19 at the (e.g., inlet of the) heat sink, and $R_{hs}$ is the thermal resistance of the heat sink. As described herein, $Q_0$ is the heat generated by the IT component 13, and $Q'$ is the heat generated by the TEC element, where heat is to be removed (e.g., rejected into the coolant by the heat sink). Both heat values may be generated from the power input of both devices. For example, $$Q = R * I^2 \qquad (2)$$

where R is the electrical resistance and I is the current of the power input. Thus, $Q_0$ is the heat generated based on the power input of the IT component, and $Q'$ is the heat based on the power input that the TEC controller 12 uses to drive the TEC element. By defining temperature difference as $$\delta T = T_{Component} - T_{hs,base} \qquad (3)$$

where $T_{Component}$ is the temperature of the IT component 13 and $T_{hs,base}$ is the temperature of the base 16 of the heat sink, and after substituting $T_{hs,base}$ with $\delta T$, the temperature of the IT component is derived as $$T_{Component} = (Q_0 + Q') * R_{hs} + \delta T + T_{liquid,in} \qquad (4)$$

In one embodiment, when the TEC element 1 is active (e.g., transferring heat away from the IT component), $\delta T < 0$.

To determine $\delta T_c$, $T_{component} = T_{max}$, the maximum (allowable) temperature for the IT component (e.g., before overheating), which may be predefined (e.g., by a manufacturer of the IT component), and $Q'=0$, meaning that the critical temperature indicates the minimum requirement for the TEC element thermal performance in the immersion cooling system. As a result, two formulas are derived. The first, if $T_{max} < Q_0 * R_{hs} + T_{liquid,in}$, then $$\delta T_c = |T_{max} - Q_0 * R_{hs} - T_{liquid,in}| \qquad (5)$$

Thus, if $T_{max} < Q_0 * R_{hs} + T_{liquid,in}$, the system is not able to handle the heat load $Q_0$ without the TEC element being active. If, however, $T_{max} \geq Q_0 * R_{hs} + T_{liquid,in}$, then $$\delta T_c = 0 \qquad (6)$$

Thus, the TEC controller 12 may compute $\delta T_c$, from either equation (5) or equation (6) above based on (either of) the inequalities mentioned herein.

The process 40 determines a temperature difference, $\delta T^*$, of the TEC element 1 and a first voltage, $U^*$, of the TEC element based on the power input of the IT component (at block 43). In one embodiment, $\delta T^*$ may be the temperature difference $T_0-T_1$ illustrated in FIG. 1, which is a negative temperature value between its two conducting surfaces. The cold side that is contacting the IT component has a lower temperature than the hot side that is in contact with the heat sink. In some embodiments, the TEC controller may minimize the power overhead by determining a maximum coefficient of performance (COP), where COP is equal to the removed heat load from the IT component (e.g., $Q_0$) divided by the power input of the TEC element. Thus, as COP grows, less power input to drive the TEC element is needed to remove a same amount of heat generated by the IT component. In one embodiment, to determine $\delta T^*$ and $U^*$ that correspond to the maximum COP, the TEC controller may determine an efficiency mode graph, as illustrated in FIG. 5.

Figure 5:
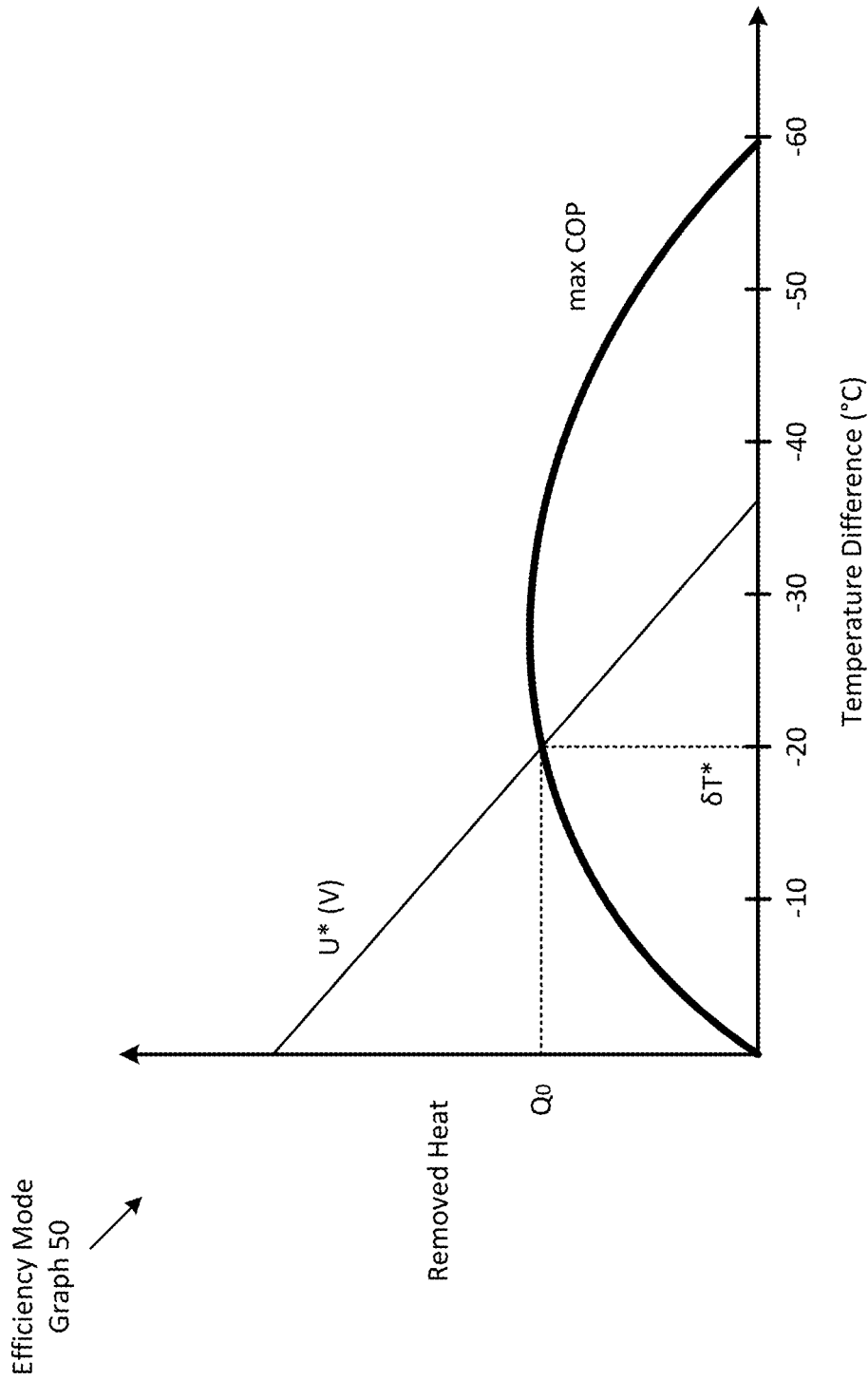
FIG. 5 illustrates an example of an efficiency mode graph that shows a maximum coefficient of performance (COP) of the TEC element according to one embodiment.

FIG. 5 illustrates an example of an efficiency mode graph 50 that shows a maximum coefficient of performance (max COP) of the TEC element according to one embodiment. Specifically, the graph 50 shows removed heat from the IT component (and/or heat generated by the TEC element while active) with respect to temperature differences. In addition, this graph shows a max COP curve, where any point along the curve represents a minimum power overhead required to provide a particular temperature difference based on a removed heat value. The graph also shows a voltage line, $U^*$, which represents a (e.g., constant) input voltage of the TEC element. Points along the voltage line represents how applying a constant voltage across the TEC while the heat produced by the IT component (which is to be removed by the TEC element) changes (along the y-axis), the temperature difference of the TEC element also changes (along the x-axis). As shown, as the heat increases, the temperature difference decreases for the same voltage. In one embodiment, the graph 50 is a predefined graph. In another embodiment, the graph is based on the components (e.g., the IT component and the TEC element). Thus, different components may have different efficiency graphs.

To determine $\delta T^*$ and $U^*$, the TEC controller determines at what point the max COP curve intersects (e.g., a horizontal line is drawn from) $Q_0$. The point at which horizontal line intersects max COP defines $\delta T^*$ and $U^*$, where the voltage is a predefined line that passes through that point. In one embodiment, if the horizontal line from $Q_0$ were to intersect max COP more than once (e.g., twice), $\delta T^*$ and $U^*$ may be defined at the intersection point that has the lowest temperature difference (absolute value).

In another embodiment, to determine these values, the TEC controller 12 may use the (e.g., heat) determined power input of the IT component to perform a table lookup into a data structure that associates removed heat, temperature difference, max COP, and input voltage. Specifically, the TEC controller may perform the table lookup using $Q_0$ as input, which in return the table outputs $\delta T^*$ and $U^*$ that are associated with the max COP at $Q_0$.

Returning to FIG. 4, the process 40 determines whether the (determined) temperature difference is greater than the critical temperature difference (at decision block 44). Specifically, the TEC controller 12 determines whether the absolute value of $|\delta T^*|$ is greater than $\delta T_c$. If so, the process 40 applies the first voltage across the TEC element 1 (at block 45). Specifically, the TEC controller applies $U^*$ across the TEC element. If, however, the determined temperature difference is not greater than critical temperature difference, the process determines a second voltage, $U^{*\prime}$, based on the critical temperature difference (at block 46). In one embodiment, the TEC controller may determine $U^{*\prime}$ based on the efficiency mode graph 50 (and/or data structure), as described herein. For example, to determine $U^{*\prime}$, the TEC controller may identify a point along a horizontal line from $Q_0$ that intersects a temperature difference of $(-\delta T_c)$ in the graph 50. Once the intersection point is found, the TEC controller may determine $U^{*\prime}$ that is associated with that point (e.g., based on a table lookup). In another embodiment, the TEC controller may use the critical temperature difference to perform a table lookup into a data structure that associates critical temperature differences with voltage values. Once determined, the process 40 applies the second voltage across the TEC element (at block 47).

FIG. 6 is a flow chart of a process performed by an immersion cooling system to operate in a performance mode according to one embodiment. Specifically, this figure illustrates process 60 in which the TEC controller 12 may operate in the performance (e.g., a second operational) mode in which all of the heat generated by an active IT component is transferred by the TEC element to the heat sink while the temperature of the IT component is a lowest available temperature, which is the lowest available temperature the (TEC element of the) immersion cooling system can set the IT component while the TEC element is in operation.

The process 60 begins by determining the power input of the active IT component on which the TEC element and the heat sink are mounted (at block 61). In one embodiment, the controller may perform similar operations as in block 41 of FIG. 4 to determine the power input of the active IT component.

The process 60 determines an operating current, $I^*$, for the TEC element that is associated with a lowest available temperature, $T_{low}$, of the IT component based on the power input (at block 62). Specifically, given a constant $Q_0$ and $T_{liquid,in}$, taking the derivative of TEC current in equation (4) yields $$\frac{dT_{Component}}{dI} = R_{hs}\frac{dQ'}{dI} + \frac{d(\delta T)}{dI} = R_{hs} * 2IR_{TEC} + \frac{d(\delta T)}{dI} \qquad (7)$$

where I is the operating current of the TEC element and $R_{TEC}$ is the electrical resistance of the TEC element. In one embodiment, $$\frac{dT_{Component}}{dI} < 0$$

corresponds to the IT component temperature decreasing as the operating current of the TEC element increases. In another embodiment, $$\frac{dT_{Component}}{dI} > 0$$

corresponds to the IT component temperature increasing as the operating current of the TEC element increases. Letting $$\frac{dT_{Component}}{dI} = 0,$$

the lowest available temperature of the IT component is obtained and I (where I=I*) may be solved, which represents the performance mode.

Figure 7:
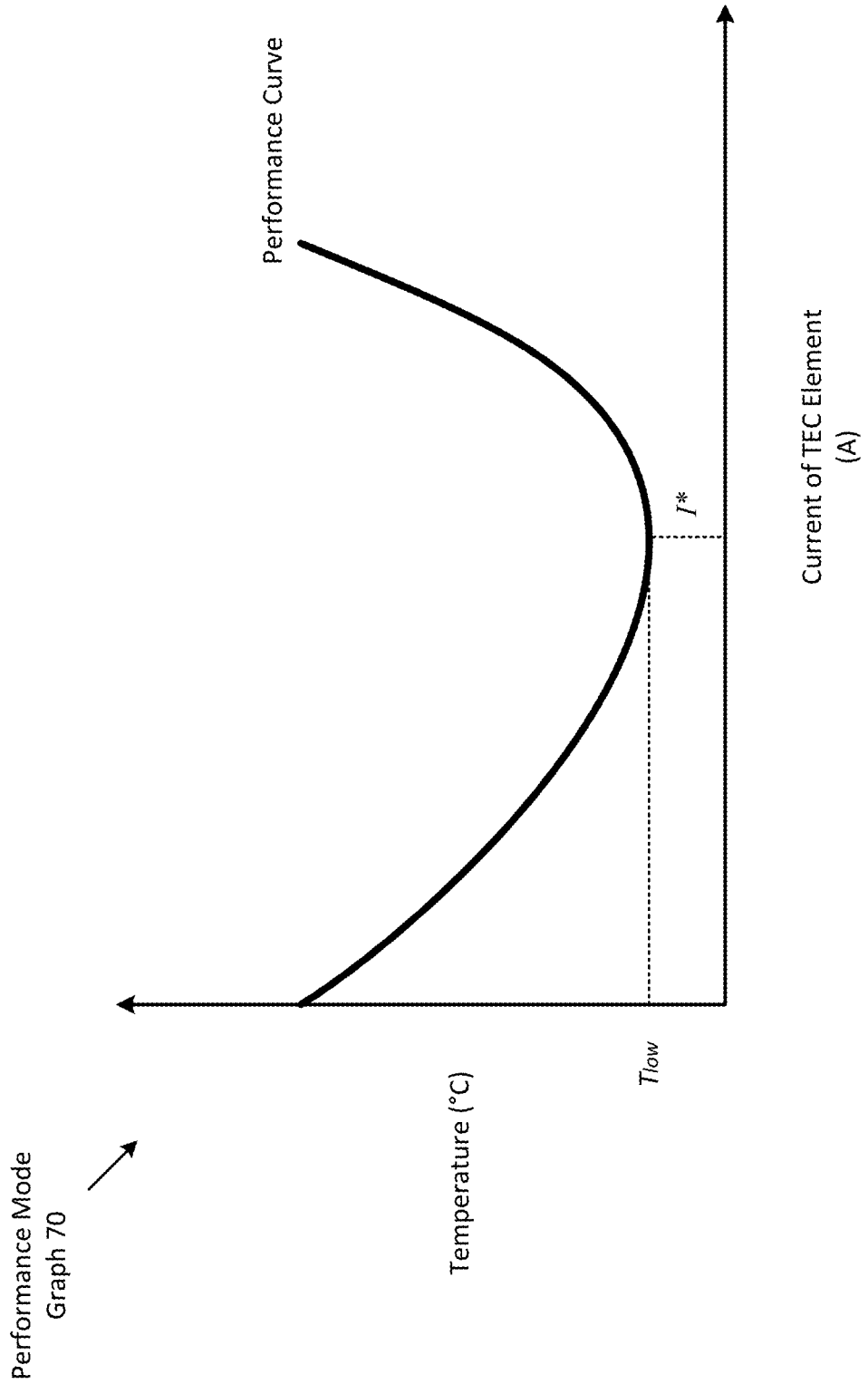
FIG. 7 illustrates an example of a performance mode graph according to one embodiment.

In one embodiment, the TEC controller 12 is configured to determine $T_{low}$ and I*, which correspond to the lowest available temperature of the IT component by analyzing a performance mode graph, as illustrated in FIG. 7.

FIG. 7 illustrates an example of a performance mode graph 70 according to one embodiment. The graph 70 shows the temperature of the IT component 13 with respect to the current of the TEC element. Specifically, the graph includes a performance curve that is a graphical representation of Equation (7) above. In another embodiment, the performance graph (or more specifically the performance curve) may be a predefined graph. In another embodiment, the graph may be based on the determined power input of the IT component. For example, the TEC controller may retrieve the graph 70 (e.g., from local memory), where the graph is associated with the determined power input. In other words, the TEC controller may store several graphs 70 in local memory, each associated with a different power input. Once the performance graph 70 is determined (and retrieved), the TEC controller determines a lowest point of the performance curve, which represents $T_{low}$ and I*, as shown.

In some embodiments, $T_{low}$ and I* may be determined based on a performance of a table lookup into a data structure that associates lowest available temperatures of IT components with input currents of TEC elements.

Returning to FIG. 6, the process 60 determines whether the lowest available temperature is less than a maximum temperature of the IT component (at decision block 63). Specifically, the TEC controller determines the maximum available temperature of the IT component, which may be a predetermined temperature (e.g., by a manufacturer of the IT component), and compares this value with the lowest available temperature. Thus, the TEC controller may retrieve this value from (e.g., local) memory. If so, the process 60 applies a voltage such that the determined operating current, I* is supplied to the TEC element 1 (at block 64). If, however, the lowest available temperature is greater than the maximum temperature of the IT component, the process 60 deactivates the active IT component (at block 65). In one embodiment, the TEC controller 12 deactivates the IT component because if the lowest available temperature is greater than the maximum temperature, the TEC controller may be unable to sufficiently cool the IT component, which may ultimately result in overheating and failure of the component.

As described herein, the TEC controller may operate in one of several operational modes. In one embodiment, the TEC controller 12 may be configured to determine which mode to operate. Specifically, the TEC controller 12 may be configured to determine whether the TEC element is to operate (e.g., transfer heat away from a corresponding IT component) according to which of the first operational mode or the second operational mode the TEC controller is to operate. For example, the TEC controller may be configured to operate in one of the operational modes based on whether the power input of the IT component exceeds a power threshold (e.g., a predefined threshold). For instance, the TEC controller may be configured to select the first operational mode when the power input of the active IT component is less than a power threshold (which may be a predefined threshold). Conversely, the TEC controller may be configured to select the second operational mode when the power input of the active IT component is greater than the power threshold. Thus, the TEC controller may be configured to operate in either mode in response to changes in the power input. In one embodiment, the TEC controller may change (or adapt) operational modes based on real-time power readings of the IT component. In another embodiment, the TEC controller may be configured to operate in one of the operational modes based on user input. For example, the TEC controller may be configured to receive user input (e.g., via a user interface, such as a desktop computer with which the TEC controller is communicatively coupled), and in response, select one of the operational modes based on the user input.

FIG. 8 is a flow chart of a process performed by an immersion cooling system according to one embodiment. The process 80 begins by determining a power input of an active IT component that is mounted on a piece of IT equipment contained within a coolant tank that has liquid coolant, where mounted on the IT component is a TEC element and a heat sink in a stack in which the TEC element is disposed between the IT component and the heat sink, where the stack is at least partially submerged within the liquid coolant (at block 81). The process 80 determines whether the TEC element is to operate according to a first operational mode or a second operational mode (at block 82). The process 80, in response to determining that the TEC element is to operate according to the first operational mode, computes a critical temperature difference of the TEC element, determines a temperature difference of the TEC element and a voltage based on the power input, determines whether the temperature difference is greater than the critical temperature difference, and, in response to determining that the temperature difference is greater than the critical temperature difference, applies the voltage across the TEC element (at block 83).

The cooling systems described thus far are immersion cooling systems that are arranged to cool electronics using TEC elements that are at least partially submerged in coolant. In one embodiment, any of the cooling systems described herein may deployed as air-cooled cooling systems. For example, the cooling system 10 illustrated in FIG. 2 may be air cooled, such that heat transferred to the fins 17 of the heat sink 15 by the TEC element 1 is rejected into air that is flowing onto and around the fins. In another embodiment, any of the equations illustrated thus far may also be modified for an air-cooled solution. For instance, in equation (5), to determine the critical temperature difference, rather than use the temperature of the coolant, $T_{liquid,in}$, the temperature of the ambient air, $T_{air,in}$ (e.g., air within a room that is housing the cooling system) may be used. In addition, the liquid pump 28 of the CDU 25 illustrated in FIG. 3 may be one or more fans that are controlled by the CDU and are configured to push (or pull) ambient air onto the one or more fins.

Some embodiments may perform variations to the processes described herein. For example, the specific operations of at least some of the processes may not be performed in the exact order shown and described. The specific operations may not be performed in one continuous series of operations and different specific operations may be performed in different embodiments. In another embodiment, some operations may be optional and therefore may not be performed. For example, the operations performed in block 61 may be optional, since Equation (7) defines the heat of the IT component, $Q_0$, as a constant which is dropped out by the derivative.

As previously explained, an embodiment of the disclosure may be (or include) a non-transitory machine-readable medium (such as microelectronic memory) having stored thereon instructions, which program one or more data processing components (generically referred to here as a "processor") to perform cooling operations, such as selecting and operating in one of several operational modes and controlling (or driving) one or more TEC elements according to the selected operational mode, as described herein. In other embodiments, some of these operations might be performed by specific hardware components that contain hardwired logic. Those operations might alternatively be performed by any combination of programmed data processing components and fixed hardwired circuit components.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

While certain aspects have been described and shown in the accompanying drawings, it is to be understood that such aspects are merely illustrative of and not restrictive on the broad disclosure, and that the disclosure is not limited to the specific constructions and arrangements shown and described, since various other modifications may occur to those of ordinary skill in the art. The description is thus to be regarded as illustrative instead of limiting.

In some aspects, this disclosure may include the language, for example, "at least one of [element A] and [element B]." This language may refer to one or more of the elements. For example, "at least one of A and B" may refer to "A," "B," or "A and B." Specifically, "at least one of A and B" may refer to "at least one of A and at least one of B," or "at least of either A or B." In some aspects, this disclosure may include the language, for example, "[element A], [element B], and/or [element C]." This language may refer to either of the elements or any combination thereof. For instance, "A, B, and/or C" may refer to "A," "B," "C," "A and B," "A and C," "B and C," or "A, B, and C."

What is claimed is:

1. An immersion cooling system comprising:
    a coolant tank that has liquid coolant and contains at least partially submerged within the liquid coolant 1) a thermoelectric cooling (TEC) element that is coupled to an information technology (IT) component that is mounted on a piece of IT equipment, and 2) a heat sink that is coupled to the TEC element; and
    a TEC controller that
        senses a power input of the IT component,
        determines whether the power input is less than a power threshold, and
        in response to the power input being less than the power threshold, applies a minimum input voltage across the TEC element such that a temperature of the IT component remains below a maximum temperature threshold.

2. The immersion cooling system of claim 1, wherein the TEC controller is mounted on the piece of IT equipment and is electrically coupled to the TEC element, wherein the TEC controller draws power from the piece of IT equipment to power the TEC element.

3. The immersion cooling system of claim 1, wherein the coolant tank comprises
    a supply port and a return port that are both coupled to a heat exchanger; and
    a perforated shelf that is disposed between the piece of IT equipment and the supply port such that liquid coolant supplied by the supply port passes through the perforated shelf and to the heat exchanger via the return port.

4. The immersion cooling system of claim 1,
    wherein, in response to the power input being greater than the power threshold, the TEC controller applies an input voltage across the TEC element such that the IT component is at a lowest available temperature.

5. The immersion cooling system of claim 1, wherein the TEC element and the heat sink is one integrated unit.

6. The immersion cooling system of claim 1, wherein a thermal interface material (TIM) is disposed between at least one of 1) the IT component and the TEC element and 2) the TEC element and the heat sink.

7. A method for immersion cooling an information technology (IT) component, the method comprising:
    determining a power input of an active IT component that is mounted on a piece of IT equipment contained within a coolant tank that has liquid coolant, wherein mounted on the IT component is a thermoelectric cooling (TEC) element and a heat sink in a stack in which the TEC element is disposed between the IT component and the heat sink, wherein the stack is at least partially submerged within the liquid coolant;
    computing a critical temperature difference of the TEC element;
    determining a temperature difference of the TEC element and a voltage based on the power input;
    determining whether the temperature difference is greater than the critical temperature difference; and
    in response to determining that the temperature difference is greater than the critical temperature difference, applying the voltage across the TEC element.

8. The method of claim 7, wherein determining the temperature difference and the voltage comprises using the power input to identify a maximum coefficient of performance (COP) of the TEC element that is associated with the temperature difference and the voltage.

9. The method of claim 7, wherein the voltage is a first voltage, wherein the method further comprises, in response to determining that the temperature difference is less than the critical temperature difference,
    determining a second voltage based on the critical temperature difference; and
    applying the second voltage across the TEC element.

10. The method of claim 7, wherein the voltage is a first voltage, wherein the computing the critical temperature, the determining the temperature difference, the determining whether the temperature difference is greater than the critical temperature difference, and the applying of the voltage are performed in response to determining that the TEC element is to operate in a first operational mode, wherein the method further comprises, in response to determining that the TEC element is to operate according to a second operational mode,
    determining an operating current for the TEC element that is associated with a lowest available temperature of the IT component based on the power input;
    determining whether the lowest available temperature is less than a maximum temperature of the IT component; and
    in response to determining that the lowest available temperature is less than the maximum temperature of the IT component, applying a second voltage associated with the operating current across the TEC element.

11. The method of claim 10, further comprising, in response to determining that the lowest available temperature is greater than the maximum temperature of the IT component, deactivating the active IT component.

12. The method of claim 10 further comprising
selecting the first operational mode for the TEC element to operate when the power input of the active IT component is less than a power threshold; and
selecting the second operational mode for the TEC element to operate when the power input of the active IT component is greater than the power threshold.

13. The method of claim 10 further comprising selecting one of the first and second operational modes for the TEC element to operate in response to user input.

14. A non-transitory machine-readable medium having instructions stored therein, which when executed by a processor, causes the processor to perform operations, the operations comprising:
determining an input power of an active information technology (IT) component that is mounted on a piece of IT equipment contained within a coolant tank that has liquid coolant, wherein mounted on the IT component is a thermoelectric cooling (TEC) element and a heat sink in a stack in which the TEC element is disposed between the IT component and the heat sink, wherein the stack is at least partially submerged within the liquid coolant;
computing a critical temperature difference of the TEC element;
determining a temperature difference of the TEC element and a voltage based on the input power,
determining whether the temperature difference is greater than the critical temperature difference, and
in response to determining that the temperature difference is greater than the critical temperature difference, applying the voltage across the TEC element.

15. The non-transitory machine-readable medium of claim 14, wherein determining the temperature difference and the voltage comprises using the input power to identify a maximum coefficient of performance (COP) of the TEC element that is associated with the temperature difference and the voltage.

16. The non-transitory machine-readable medium of claim 14, wherein the voltage is a first voltage, wherein the operations further comprise, in response to determining that the temperature difference is less than the critical temperature difference,
determining a second voltage based on the critical temperature difference; and
applying the second voltage across the TEC element.

17. The non-transitory machine-readable medium of claim 14, wherein the voltage is a first voltage, wherein the operations of computing the critical temperature difference, determining the temperature difference, determining whether the temperature difference is greater than the critical temperature difference, and applying the voltage are performed in response to determining that the TEC element is to operate in a first operational mode, wherein the operations further comprise, in response to determining that the TEC element is to operate according to a second operational mode,
determining an operating current for the TEC element that is associated with a lowest available temperature of the IT component based on the input power;
determining whether the lowest available temperature is less than a maximum temperature of the IT component; and
in response to determining that the lowest available temperature is less than the maximum temperature of the IT component, applying a second voltage associated with the operating current across the TEC element.

18. The non-transitory machine-readable medium of claim 17, wherein the operations further comprise, in response to determining that the lowest available temperature is greater than the maximum temperature of the IT component, deactivating the active IT component.

19. The non-transitory machine-readable medium of claim 17 comprises further operations of
selecting the first operational mode for the TEC element to operate when the input power of the active IT component is less than a power threshold; and
selecting the second operational mode for the TEC element to operate when the input power of the active IT component is greater than the power threshold.

20. The non-transitory machine-readable medium of claim 17 comprises further operations of selecting one of the first and second operational modes for the TEC element to operate in response to user input.

* * * * *